(12) United States Patent
Hirano et al.

(10) Patent No.: US 10,347,466 B2
(45) Date of Patent: Jul. 9, 2019

(54) PLASMA PROCESSING APPARATUS

(71) Applicant: TOKYO ELECTRON LIMITED, Tokyo (JP)

(72) Inventors: Takahiro Hirano, Miyagi (JP); Toshihiko Iwao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/173,241

(22) Filed: Jun. 3, 2016

(65) Prior Publication Data

US 2016/0358758 A1 Dec. 8, 2016

(30) Foreign Application Priority Data

Jun. 8, 2015 (JP) ................... 2015-115434

(51) Int. Cl.
*H01J 37/32* (2006.01)
*H01J 37/16* (2006.01)
(52) U.S. Cl.
CPC .............. *H01J 37/32238* (2013.01)
(58) Field of Classification Search
CPC .............. H01J 37/165; H01J 37/32238
See application file for complete search history.

(56) References Cited

U.S. PATENT DOCUMENTS

2002/0069971 A1\* 6/2002 Kaji ................. H01J 37/32082
156/345.46
2015/0118416 A1\* 4/2015 Jang ................. C23C 16/45519
427/575

FOREIGN PATENT DOCUMENTS

JP         3787297 B2     6/2006
JP         2007-188722 A  7/2007

\* cited by examiner

*Primary Examiner* — Nimeshkumar D Patel
*Assistant Examiner* — Jacob R Stern
(74) *Attorney, Agent, or Firm* — Rothwell, Figg, Ernst & Manbeck, P.C.

(57) ABSTRACT

Disclosed is a plasma processing apparatus that includes a processing container configured to accommodate a wafer, and a dielectric window provided to hermetically seal an opening formed in a top portion of the processing container, and configured to transmit microwaves into the processing container. The dielectric window has a thickness of $3\lambda/8$ or less (here, $\lambda$ is a wavelength of the microwaves) at least at a predetermined position where a microwave power is concentrated, and a protrusion is formed at the predetermined position on a bottom surface of the dielectric window to protrude downward from the bottom surface.

10 Claims, 10 Drawing Sheets

Flat

CRG1

CRG2 t7 t11 t15 t19

Flat t7 t11 t15 t19

CRG1

PLASMA PROCESSING APPARATUS

CROSS-REFERENCE TO RELATED APPLICATIONS

This application is based on and claims priority from Japanese Patent Application No. 2015-115434, filed on Jun. 8, 2015, with the Japan Patent Office, the disclosure of which is incorporated herein in its entirety by reference.

TECHNICAL FIELD

The present disclosure relates to a plasma processing apparatus that performs a plasma processing on an object to be processed.

BACKGROUND

Conventionally, a plasma processing apparatus using a radial line slot antenna has been known as a plasma processing apparatus that performs a predetermined plasma processing on an object to be processed such as, for example, a semiconductor wafer. The radial line slot antenna is disposed in such a manner that a slot plate with a plurality of slots is disposed in a state where a slow wave plate is laid on the slot plate above a dielectric window disposed in a ceiling opening of a processing container, and the slot plate is connected to a coaxial waveguide at the central portion thereof. With such a configuration, microwaves generated by a microwave generator pass through the coaxial waveguide. Then, the microwaves are radially transferred in the radial direction by the slow wave plate via the coaxial waveguide to generate circularly polarized waves by the slot plate, and then, radiated from the slot plate into the processing container through the dielectric window. Then, high density plasma having a low electron temperature may be generated by the microwaves within the processing container under a low pressure, and a plasma processing such as, for example, a film forming processing or an etching processing, may be performed by the generated plasma.

In order to perform the plasma processing uniformly, it is necessary to make the plasma distribution within the processing container uniform. Thus, in the plasma processing apparatus disclosed in Japanese Patent No. 3787297, it is proposed to periodically form uneven portions, which consist of protrusions, at a pitch of 7.5 mm to 30 mm on the processing container side surface of the dielectric window. In such a case, according to the periodic existence of the uneven portions, generation of surface waves, which are resonant with an electron density, is suppressed, and plasma is generated in which the electron density is not extremely changed regardless of whether the microwave power is large or small. In addition, it is ensured that stable plasma is generated within the processing container.

SUMMARY

The present disclosure relates to a plasma processing apparatus that performs a plasma processing on an object to be processed ("workpiece"). The plasma processing apparatus includes a processing container configured to accommodate the workpiece; and a dielectric window provided to hermetically seal an opening formed in a top portion of the processing container, and configured to transmit microwaves into the processing container. The dielectric window has a thickness of $3\lambda/8$ or less (here, $\lambda$ is a wavelength of the microwaves) at least at a predetermined position where a microwave power is concentrated, and a protrusion is formed at the predetermined position on a bottom surface of the dielectric window to protrude downward from the bottom surface.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A to 5C are views illustrating three dielectric window models that are used for simulation in which FIG. 5A illustrates a first model, FIG. 5B illustrates a second model, and FIG. 5C illustrates a third model.

FIGS. 8A to 8C are graphs representing a controllability of a microwave power distribution in a case where an electron density was changed, in which FIG. 8A illustrates a case in which the first model was used, FIG. 8B illustrates a case in which the second model was used, and FIG. 8C illustrates a case in which the third model was used.

FIGS. 9A and 9B illustrate electric field distributions at the electron density of 1e+17, in which FIG. 9A illustrates a case in which the first model was used, and FIG. 9B illustrates a case in which the second model was used.

DETAILED DESCRIPTION

Figure 1:
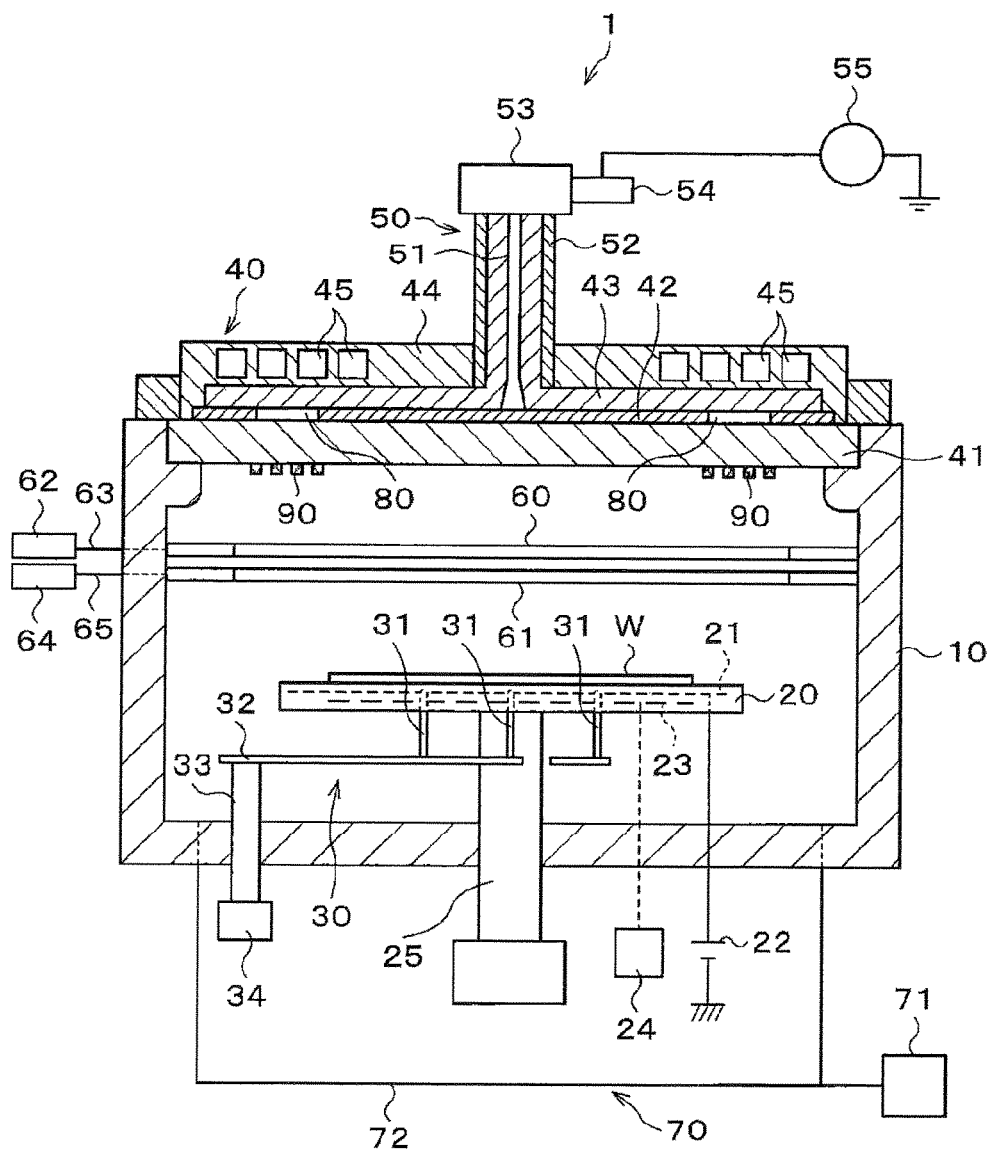
FIG. 1 is a vertical cross-sectional view schematically illustrating a configuration of a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There is a case in which a circumferential deviation occurs in a plasma distribution. As a result of the inventors' examination, it has been found that one of the causes of the circumferential deviation of the plasma distribution is the influence of waves reflected from the plasma (plasma interface). For this reason, it is required to suppress reflected waves, i.e. to enhance a microwave power absorption efficiency with respect to plasma in order to suppress the circumferential deviation.

Meanwhile, there is a case in which a microwave power is not concentrated to a desired position on the bottom surface of the dielectric window even if the microwave power absorption efficiency is high. For example, in a plasma processing apparatus using a radial line slot antenna, while the control of the plasma distribution is ensured by a plurality of slots (slot pattern) formed in the slot plate, there is a case in which the microwave power is not concentrated to an area below the slots. In such a case, it is required to control the microwave power distribution since the plasma distribution is not made to be uniform.

In order to make the plasma distribution within the processing container uniform, it is required to make the efficient absorption of a microwave power and the distribution control of a microwave power compatible. However, in the plasma processing apparatus disclosed in Japanese Patent No. 3787297, the absorption efficiency (suppression of reflected waves) and the distribution control of a microwave power have not been considered at all. Accordingly, there has remained room for improvement in the plasma processing.

In consideration of the problems described above, the present disclosure is to make a plasma distribution in a plasma processing uniform.

In order to achieve the objects described above, the present disclosure provides a plasma processing apparatus that performs a plasma processing on a workpiece. The plasma processing apparatus includes: a processing container configured to accommodate the workpiece therein; and a dielectric window provided to hermetically seal an opening formed in a top portion of the processing container, and configured to transmit microwaves into the processing container. The dielectric window has a thickness of $3\lambda/8$ or less (here, $\lambda$ is a wavelength of the microwaves) at least at a predetermined position where a microwave power is concentrated, and a protrusion is formed at the predetermined position on a bottom surface of the dielectric window to protrude downward from the bottom surface.

The inventors performed tests of branching microwaves using a rectangular waveguide type power splitter. From the result of the tests, it has been found that the waves reflected from the plasma cause disturbance in a distribution ratio of a microwave power. Here, in the slot plate, the plurality of slots arranged in the circumferential direction may also be regarded as a power splitter in the circumferential direction. Thus, it is presumed that the distribution ratio of each slot is disturbed by the waves reflected from the plasma so that the circumferential deviation is caused in the plasma distribution, as described above. Based on this presumption, it has been found that it is necessary to suppress waves reflected from the plasma to the slots.

In addition, in order to make the plasma distribution uniform, there may be a case in which a position where it is required to concentrate a microwave power to the plasma exists other than the above-mentioned slot position. Even in such a case, it is necessary to suppress the waves reflected to the predetermined position.

In addition, through the inventors' examination, it has been found that, when a protrusion is formed at the predetermined position on the bottom surface of the dielectric window, the microwave power absorption efficiency to plasma is improved. In such a case, it is possible to suppress waves reflected to the predetermined position from the plasma, and to suppress the circumferential deviation of a plasma distribution, thereby making the plasma distribution uniform.

It has also been found that, when the thickness of the dielectric window is set to $3\lambda/8$ or less at least at the predetermined position, the microwave power is concentrated to the predetermined position (e.g., the slot position). In such a case, the microwave power distribution can be controlled.

As described above, according to the present disclosure, the efficient absorption and the distribution control of a microwave power can be realized, thereby making the plasma distribution uniform. The specific reasons why the efficient absorption and the distribution control of a microwave power can be realized by prescribing the thickness of the protrusions and the dielectric window will be described below.

The plasma processing apparatus further includes a slot plate provided on a top surface of the dielectric window, and including a plurality of slots to radiate microwaves to the dielectric window. The predetermined position may include a position corresponding to the slots. In addition, the predetermined position includes a position where an electron density becomes maximum within a plane of the dielectric window, other than the position corresponding to the slots.

The protrusion may have a width in a range of $\lambda/8$ to $3\lambda/8$. In addition, the height of the protrusion may be $\lambda/16$ or more.

According to the present disclosure, it is possible to control a microwave power distribution while improving a microwave power absorption efficiency in a plasma processing, so that the plasma distribution can be made uniform.

Hereinafter, an exemplary embodiment will be described in detail with reference to the accompanying drawings. FIG. 1 is a vertical cross-sectional view schematically illustrating a configuration of a plasma processing apparatus 1 according to an exemplary embodiment. In the present exemplary embodiment, descriptions will be made, as an example, on a case in which the plasma processing apparatus 1 is a film forming apparatus that performs a plasma chemical vapor deposition (CVD) processing on a surface (top surface) of a wafer W as a workpiece. In the specification and drawings, the elements having substantially the same functional configurations will be denoted by the same symbols and duplicate descriptions will be omitted. In addition, the present disclosure is not limited by the exemplary embodiment to be described below.

As illustrated in FIG. 1, the plasma processing apparatus 1 includes a processing container 10. The processing container 10 has a substantially cylindrical shape with an opened ceiling, and a radial line slot antenna 40 to be described later is disposed in the opening of the ceiling. In addition, a wafer W carry-in/out port (not illustrated) is formed in a side wall of the processing container 10, and a gate valve (not illustrated) is provided in the carry-in/out port. Further, the processing container 10 is configured to be capable of hermetically sealing the inside thereof. In addition, a metal such as, for example, aluminum or stainless steel, is used for the processing container 10, and the processing container 10 is electrically grounded.

A cylindrical mounting table 20 configured to mount a wafer W on the top surface thereof is provided on the bottom portion within the processing container 10. For example, AlN is used for the mounting table 20.

An electrode 21 for an electrostatic chuck is provided inside the mounting table 20. The electrode 21 is connected to a direct current (DC) power supply 22 that is provided outside the processing container 10. When a voltage is applied to the electrode 21 by the DC power supply 22, a Johnson-Rahbeck force is generated on the top surface of the mounting table 20 so that the wafer W can be electrostatically attracted onto the mounting table 20.

In addition, a temperature adjustment mechanism 23 is provided inside the mounting table 20 to circulate, for example, a cooling medium. The temperature adjustment mechanism 23 is connected to a liquid temperature adjustment unit 24 that is provided outside the processing container 10 and configured to adjust the temperature of the cooling medium. In addition, the temperature of the cooling medium is adjusted by the liquid temperature adjustment unit 24 such that the temperature of the mounting table 20 can be controlled, and as a result, the wafer W mounted on the mounting table 20 can be maintained at a predetermined temperature.

In addition, a high frequency power supply for RF bias (not illustrated) may be connected to the mounting table 20. The high frequency power supply outputs high frequency waves having a predetermined frequency suitable for controlling the energy of ions drawn into the wafer W (e.g., high frequency waves of 13.56 MHz) with a predetermined power.

In addition, the mounting table 20 includes through-holes (not illustrated) that penetrate the mounting table 20 in the thickness direction at, for example, three (3) locations. Lift pins 31 to be described later are inserted through the through holes, respectively.

A support member 25 is provided on the bottom surface of the mounting table 20 to support the mounting table 20.

Below the mounting table 20, a lift mechanism 30 is provided to properly lift the wafer W laid on the mounting table 20. The lift mechanism 30 includes lift pins 31, a plate 32, a strut 33, and a lift drive unit 34. On the top surface of the plate 32, for example, three (3) lift pins 31 are provided, and configured to protrude from the top surface of the mounting table 20. The plate 32 is supported on the strut 33 that penetrates the bottom surface of the processing container 10. The lift drive unit 34 disposed outside the processing container 10 is installed at the lower end of the strut 33. As the lift drive unit 34 is operated, the three lift pins 31, which penetrate the mounting table 20, move up and down to be switched between a state where the upper ends of the lift pins 31 protrude upward from the top surface of the mounting table 20 and a state where the upper ends of the lift pins 31 are drawn into the inside of the mounting table 20.

In the ceiling opening of the processing container 10, a radial line slot antenna 40 is installed to supply microwaves for plasma generation. The radial line slot antenna 40 includes a dielectric window 41, a slot plate 42, a slow wave plate 43, and a shield cover 44.

The dielectric window 41 is installed to hermetically seal the ceiling opening of the processing container 10 through a sealing material such as, for example, an O-ring (not illustrated). Accordingly, the inside of the processing container 10 is maintained in an airtight state. A dielectric such as, for example, $Al_2O_3$ or AlN, is used for the dielectric window 41, and the dielectric window 41 transmits microwaves. Detailed configurations of the dielectric window 41 will be described later.

The slot plate 42 is installed as the top surface of the dielectric window to be opposite to the mounting table 20. A conductive material such as, for example, copper, aluminum, or nickel, is used for the slot plate 42. Detailed configurations of the slot plate 42 will be described later.

The slow wave plate 43 is installed on the top surface of the slot plate 42. A low loss dielectric material such as, for example, $Al_2O_3$ or AlN, is used for the slow wave plate 43, and the slow wave plate 43 shortens the wavelength of the microwaves.

The shield cover 44 is installed to cover the slow wave plate 43 and the slot plate 42 on the top surface of the slow wave plate 43. A plurality of annular flow paths 35 are formed inside the shield cover 44 to circulate, for example, a cooling medium. The dielectric window 41, the slot plate 42, the slow wave plate 43, and the shield cover 44 are adjusted to a predetermined temperature by the cooling medium flowing through the flow path 45.

A coaxial waveguide 50 is connected to the center of the shield cover 44. The coaxial waveguide 50 includes an inner conductor 51 and an outer conductor 52. The inner conductor 51 is connected to the slot plate 42. The lower end portion of the inner conductor 51 is formed in a cone shape, and has a taper shape of which the diameter increases toward the slot plate 42 side. The microwaves are adapted to be efficiently propagated with respect to the slot plate 42 by the lower end portion.

To the coaxial waveguide 50, a mode converter 53 configured to convert microwaves into a predetermined vibration mode, a rectangular waveguide 54, and a microwave generator 55 configured to generate microwaves are connected in this order from the coaxial waveguide 50 side toward the microwave generator 55. The microwave generator 55 generates microwaves having a predetermined frequency (e.g., 2.45 GHz).

With this configuration, the microwaves generated by the microwave generator 55 are sequentially propagated to the rectangular waveguide 54, the mode converter 53, and the coaxial waveguide 50, and supplied to the inside of the radial line slot antenna 40. The microwaves are compressed by the slow wave plate 43 so that the wavelength of the microwaves is shortened, and generate circularly polarized waves with the slot plate 42. Then, the microwaves are transmitted through the dielectric window 41 from the slot plate 42 to be radiated into the processing container 10. By the microwaves, the processing gas is turned into plasma within the processing container, and a plasma processing is performed on the wafer W by the plasma.

Within the processing container 10, an upper shower plate 60 and a lower shower plate 61 are provided above the mounting table 20. The upper shower plate 60 and the lower shower plate 61 are constituted with hollow tubular members such as, for example, quartz tubes. In the upper shower plate 60 and the lower shower plate 61, a plurality of openings (not illustrated) are provided to be distributed in order to supply a gas to the wafer W on the mounting table 20.

A plasma generating gas supply source 62 disposed outside the processing container 10 is connected to the upper shower plate 60 via a pipe 63. The plasma generating gas supply source 62 stores a plasma generating gas such as, for example, Ar gas. The plasma generating gas is introduced into the upper shower plate 60 from the plasma generating gas supply source 62 via the pipe 63, and the plasma generating gas is supplied into the processing container 10 in a uniformly dispersed state.

A plasma generation gas supply source 64 disposed outside the processing container 10 is connected to the upper shower plate 61 via a pipe 65. The processing gas supply source 64 stores a processing gas according to a film to be formed. For example, in the case where a SiN film is formed on the surface of the wafer W, for example, trisilylamine (TSA), $N_2$ gas or $H_2$ gas is stored as a processing gas, and in the case where a $SiO_2$ film is formed, for example, tetraethylorthosilicate (TEOS) is stored. The processing gas is introduced into the lower shower plate 61 from the processing gas supply source 64 via the pipe 65, and supplied into the processing container 10 in the state of being uniformly dispersed.

On the bottom surface of the processing container 10, a decompressing mechanism 70 is provided so as to reduce the pressure of the atmosphere within the processing container 10. The decompressing mechanism 70 has a configuration in which an exhaust unit 71 including, for example, a vacuum pump is connected to the bottom surface of the processing container 10 via an exhaust pipe 72. The exhaust unit 71 may exhaust the atmosphere within the processing container 10 so as to reduce the pressure within the processing container 10 to a predetermined vacuum degree.

Next, the detailed configuration of the above-mentioned dielectric window 41 and slot plate 42 will be described.

Figure 2:
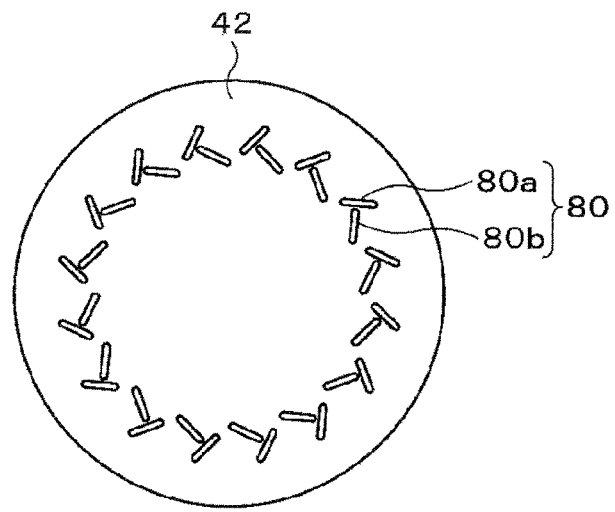
FIG. 2 is a top plan view schematically illustrating a configuration of a slot plate.

As illustrated in FIG. 2, the slot plate 42 is substantially disc-shaped. A plurality of slots 80 are formed in the slot plate 42 so as to radiate microwaves. That is, the slot plate 42 functions as an antenna. The plurality of slots 80 are formed on the a circle concentric to the slot plate 42 and arranged at a predetermined interval in the circumferential direction. Each slot 80 has two slot holes 80a and 80b formed by, for example, elongated holes or slits. The slot hole 80a and the slot hole 80b are formed and arranged to extend in crossing or orthogonal directions.

Figure 3:
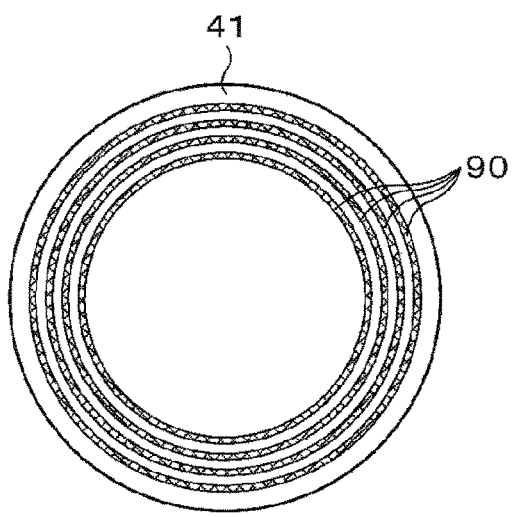
FIG. 3 is a bottom plan view of a dielectric window.
Figure 4:
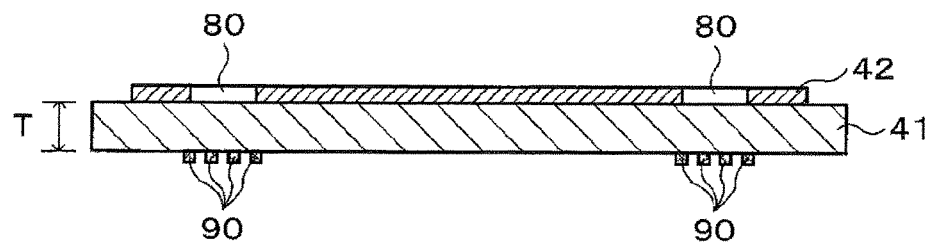
FIG. 4 is a vertical cross-sectional view schematically illustrating configurations of the dielectric window and the slot plate.

As illustrated in FIGS. 3 and 4, the dielectric window 41 is substantially disc-shaped and has a flat bottom surface. The thickness T of the dielectric window 41 is $3\lambda/8$ or less with respect to the wavelength $\lambda$ of microwaves. On the bottom surface of the dielectric window 41, a plurality of (e.g., four (4)) annular protrusions 90 are formed to protrude downwardly from the bottom surface. The plurality of protrusions 90 are formed on circles concentric to the slot plate 42 and at a predetermined interval in the radial direction. In addition, the plurality of protrusions 90 are disposed at the positions corresponding to the slots 80 of the slot plate 42, i.e. below the slots 80.

Next, descriptions will be made on a plasma processing of a wafer W which is performed using the plasma processing apparatus 1 configured as described above.

First, the wafer W carried into the processing container 10 is mounted on the mounting table 20 by the lift pins 31. At that time, the DC power supply 22 is turned ON so as to apply a DC voltage to the electrode 21 of the mounting table 20 so that the wafer W is attracted to and held by the mounting table 20.

Then, the inside of the processing container 10 is hermetically sealed, and the atmosphere within the processing container 10 is decompressed to a predetermined pressure (e.g., 400 mTorr (=53 Pa)). In addition, a plasma generating gas is supplied into the processing container 10 from the upper shower plate 60, and a processing gas for plasma film formation is supplied from the lower shower plate 61 into the processing container 10.

When the plasma generating gas and the processing gas are supplied into the processing container 10 as described above, the microwave generator 55 is operated, and microwaves having a predetermined power with a frequency of, for example, 2.45 GHz are generated in the microwave generator 55. Then, an electric field is generated on the bottom surface of the dielectric window 41 such that the plasma generating gas is turned into plasma, and the processing gas is further turned into plasma, so that a film forming processing is performed on the wafer W by the active species generated at that time. In this way, a predetermined film is formed on the surface of the wafer W.

Then, when the predetermined film is grown so that the film of a predetermined thickness is formed on the wafer W, the supply of the plasma generating gas and the processing gas and the irradiation of the microwaves are stopped. Then, the wafer W is carried out from the processing container 10 such that a series of plasma film forming processings are terminated.

According to the exemplary embodiment described above, since the protrusions 90 are formed on the bottom surface of the dielectric window 41 and below the slots 80, the microwave power absorption efficiency may be improved, and the waves reflected to the slots 80 from the plasma may be suppressed. In addition, since the thickness T of the dielectric window 41 is $3\lambda/8$ or less, the microwave power may be concentrated to the location below the slots 80. By realizing the compatibility of the efficient absorption and the distribution control of a microwave power as described above, it is possible to make the plasma distribution uniform.

Figure 5A:
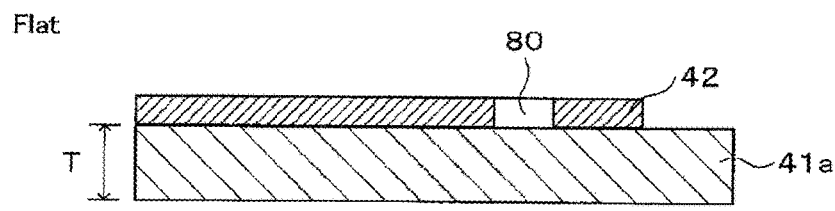
Figure 5B:
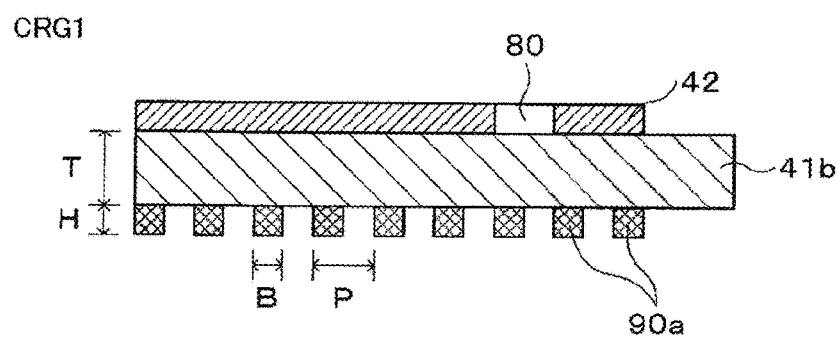
Figure 5C:
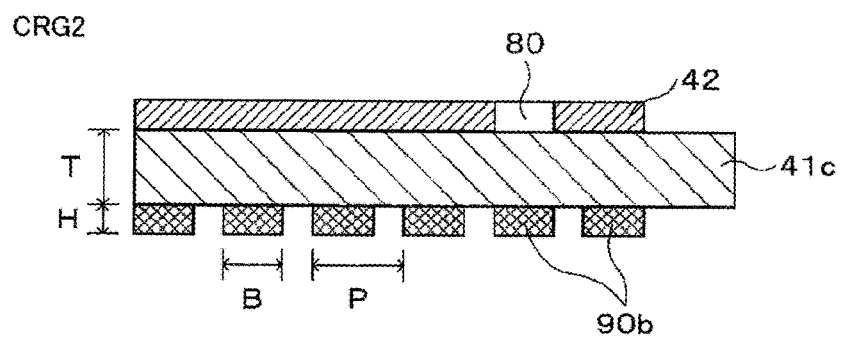

Here, descriptions will be made on the effects by the regulation of the above-mentioned protrusions 90 and the thickness T of the dielectric window 41. The inventors performed simulations using three (3) dielectric window models illustrated in FIGS. 5A to 5C. FIG. 5A illustrates a first model Flat in which protrusions are not formed on the bottom surface of the dielectric window 41a. FIG. 5B illustrates a second model CRG1 in which protrusions 90a are formed on the bottom surface of the dielectric window 41b. The width B of the protrusions 90a is 5 mm, the interval P of the protrusions 90a is 5 mm, and the height H of the protrusions 90a is 5 mm. FIG. 5C illustrates a third model CRG2 in which protrusions 90b are formed on the bottom surface of the dielectric window 41c. The width B of the protrusions 90b is 5 mm, the interval P of the protrusions 90b is 10 mm, and the height H of the protrusions 90b is 5 mm. The interval P refers to a distance between two adjacent protrusions 90 and 90. In addition, in the present simulation, the wavelength $\lambda$ of microwaves is 40 mm.

Figure 6:
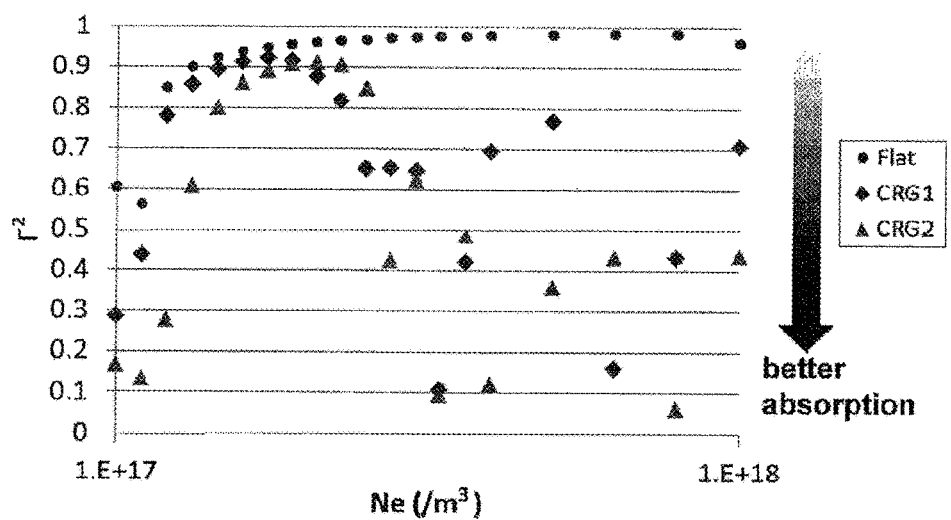
FIG. 6 is a graph representing a microwave power absorption efficiency in a case where an electron density was changed.

First, the effects of the protrusions 90 are verified. FIG. 6 represents verification results. In FIG. 6, the horizontal axis represents an electron density, and the vertical axis represents the square of a reflection coefficient of microwaves ($\Gamma^2$). In the range of 1e+17 to 1e+18 (/m$^3$), the electron density of the horizontal axis was set such that the step widths of the electron density were set to be at equal intervals on a logarithmic scale, and in the range of 4e+17 (/m$^3$) or more, the step widths were set to be twice since the power absorption was stabilized. $\Gamma^2$ of the vertical axis is an index indicating a microwave power absorption efficiency, and when the value of $\Gamma^2$ is small, the absorption efficiency is high.

Referring to FIG. 6, $\Gamma^2$ becomes smaller in the second model and the third model in which protrusions 90 are fondled on the bottom surface of the dielectric window 41, as compared with the first model in which no protrusion is formed on the bottom surface of the dielectric window 41. That is, when the protrusions 90 are formed on the dielectric window 41, the microwave power absorption efficiency to the plasma is high so that the waves reflected to the slots from the plasma can be suppressed.

Figure 7:
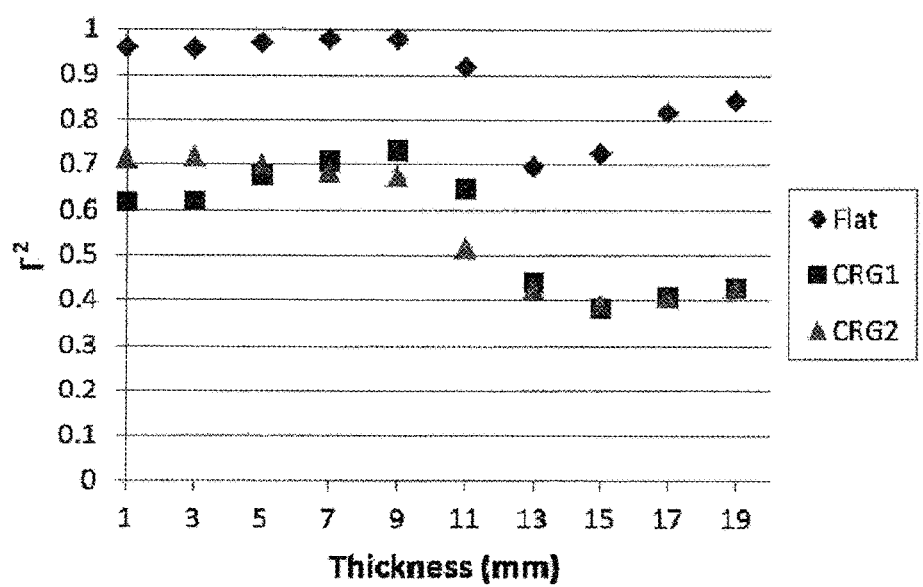
FIG. 7 is a graph representing a microwave power absorption efficiency in a case where the thickness of a dielectric window was changed.

Next, the effects of the regulation of the thickness T of the dielectric window 41 are verified. FIG. 7 was obtained by plotting an average value of $\Gamma^2$ for 20 points where the electron density is 1e+17 to 1e+18 (/m') at each thickness T of the dielectric window 41. The horizontal axis of FIG. 7 represents the thickness of the dielectric window 41, and the vertical axis represents $\Gamma^2$.

Referring to FIG. 7, in all of the first to third models, $\Gamma^2$ is decreased when the thickness T of the dielectric window 41 is increased. That is, a dielectric window 41 having a large thickness T is better for transmitting the microwave power to the plasma as the entire radial line slot antenna 40 so that the dielectric window 41 can suppress reflected waves. This is because the absorption of the microwave power occurs in a region other than the region below the slots 80.

Figure 8A:
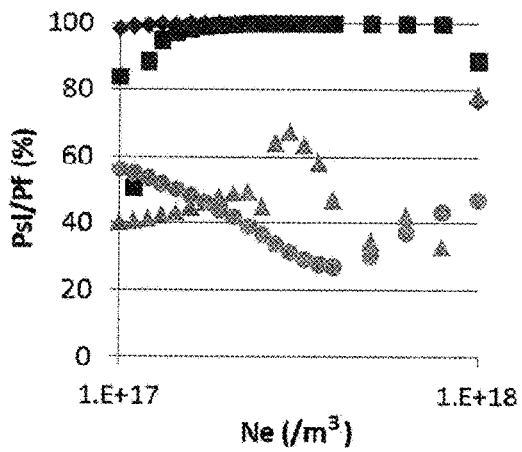
Figure 8B:
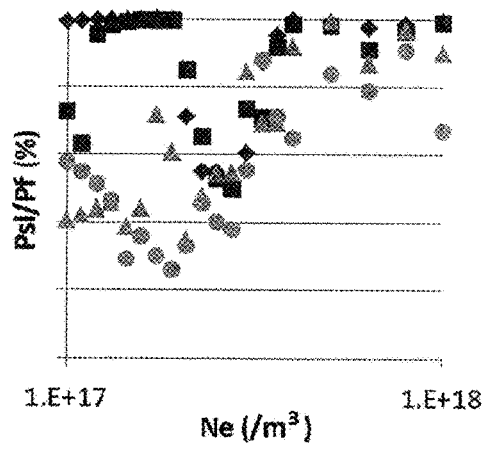
Figure 8C:
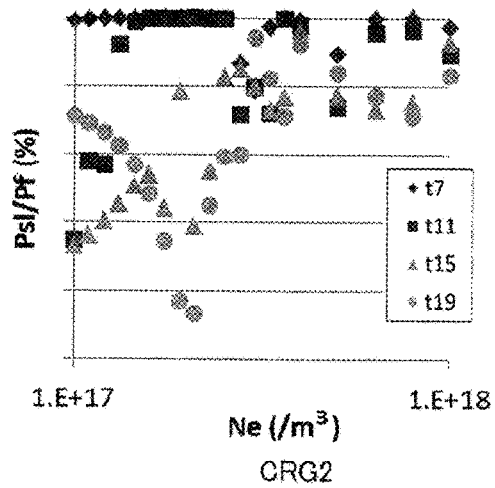

Verification is further performed with respect to the result of FIG. 7. FIGS. 8A to 8C were obtained by plotting a ratio Psl/Pf of the absorbed amount Psl (Pslot) of a microwave power in the vicinity of the slots 80 in relation to the entire microwave power Pf to plasma at each thickness T of the dielectric window 41. In FIGS. 8A to 8C, the horizontal axes represent an electron density, and the vertical axes represent Psl/Pf. In addition, it is represented that the microwave power is concentrated to the location below the slots 80 when the value of Psl/Pf is large.

In the present verification, the range of Psl of a region in the vicinity of the slots 80 was set to be 40% of the diameter of the dielectric window 41 in the radial direction, and 56% of the area of the dielectric window 41 in the axial direction. In addition, the thickness T of the dielectric window 41 was set to 7 mm, 11 mm, 15 mm, and 19 mm. FIG. 8A represents a verification result obtained using the first model, FIG. 8B represents a verification result obtained using the second model, and FIG. 8C represents a verification result obtained using the third model.

Referring to FIGS. 8A to 8C, in all of the first to third models, when the thickness T of the dielectric window 41 is increased, Psl/Pf is decreased, and the level of the concentration of the microwave power below the slots 80 is decreased.

Figure 9A:
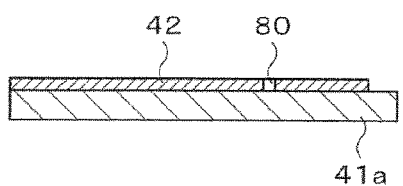
Figure 9A:
Figure 9A:
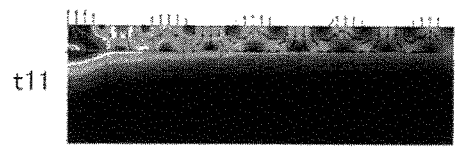
Figure 9A:
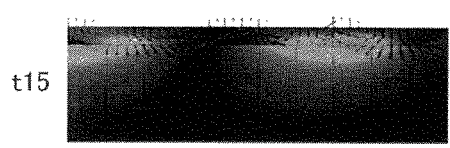
Figure 9A:
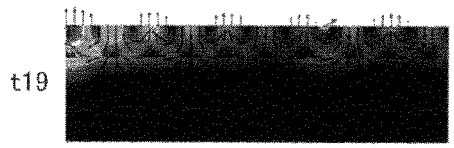
Figure 9B:
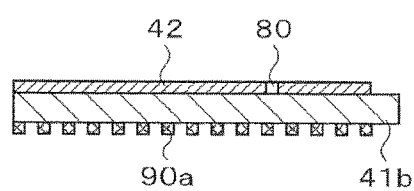
Figure 9B:
Figure 9B:
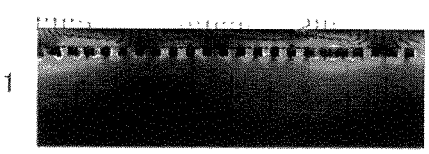
Figure 9B:
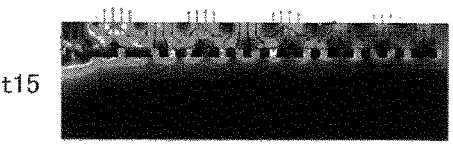
Figure 9B:

FIGS. 9A and 9B represent electric field distributions in the electron density of 1e+17, as an example of the results of FIGS. 8A to 8C. FIG. 9A represents an electric field distribution obtained using the first model, and FIG. 9B represents an electric field distribution obtained using the second model.

Referring to FIGS. 9A and 9B, in both of the first and second models, in the case where the thickness T of the dielectric window 41 is small, a strong electric field is confined to the area below the slots 80. Meanwhile, when the thickness T of the dielectric window 41 is large, the strong electric field is generated over a wide region of the dielectric window 41 without being confined to the area below the slots 80. From the results of FIGS. 8A to 8C and FIGS. 9A and 9B, it is required to prescribe the thickness T, regardless of the shape of the dielectric window 41, in order to control the plasma distribution.

Figure 10:
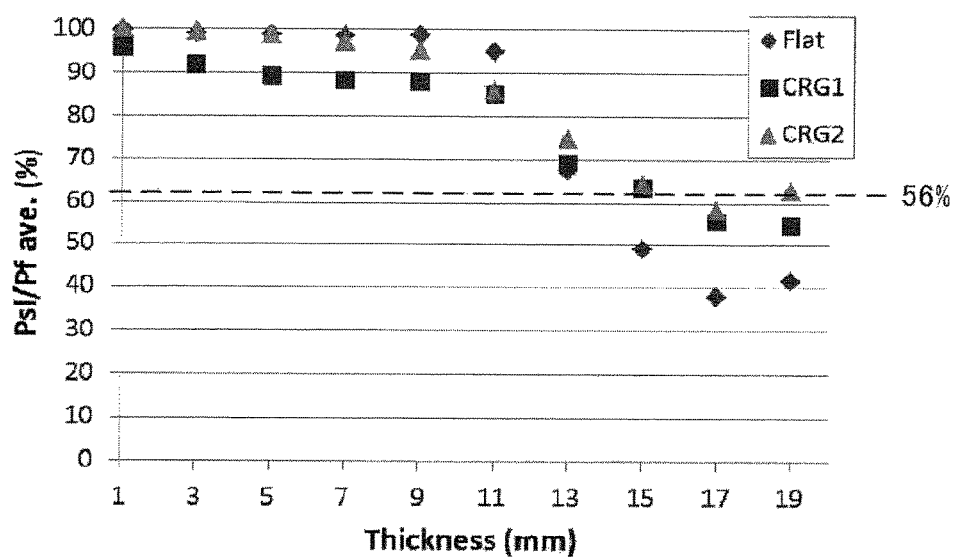
FIG. 10 is a graph representing a controllability of a microwave power distribution in a case where the thickness of a dielectric window was changed.

Thus, verification is further performed in order to analyze the thickness T of the dielectric window 41 required for controlling the plasma distribution. FIG. 10 was obtained by plotting an average value of Psl/Pf for 20 points where the electron density is 1e+17 to 1e+18 (/m³) at each thickness T of the dielectric window 41. The horizontal axis of FIG. 10 represents the thickness of the dielectric window 41, and the vertical axis represents an average of Psl/Pf.

Here, as described above, in the present simulation, the area occupied by a region in the vicinity of the slots 80 (range of Psl) is set to 56% in relation to the area of the dielectric window 41. Then, when 56% of the microwave power flows to the area below the slots 80, i.e. when Psl/Pf is larger than 56%, it may be determined that the microwave power (electric field) is concentrated to the area below the slots 80.

Referring to FIG. 10, when the thickness T of the dielectric window 41 is 15 mm or less, i.e. $3\lambda/8$ or less, Psl/Pf becomes larger than 56%. Accordingly, when the thickness T of the dielectric window 41 is $3\lambda/8$ or less, the microwave power may be concentrated to the area below the slots 80.

Figure 11:
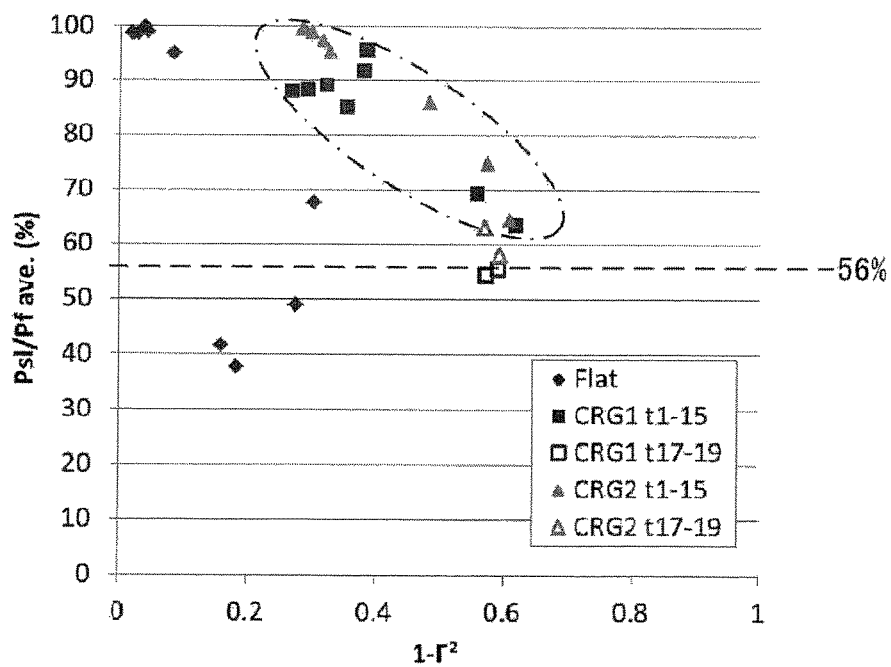
FIG. 11 is a graph that integrates simulation results.

The summary of the foregoing verification results will be described with reference to FIG. 11. FIG. 11 represents a correlation between $1-\Gamma^2$ (horizontal axis) and an average of Psl/Pf (vertical axis). As $1-\Gamma^2$ is increased, the microwave power absorption efficiency becomes better, and as Psl/Pf is increased, the microwave power is more concentrated to the area below the slots 80. That is, as going right upward in the graph of FIG. 11, the plasma distribution may be uniformly controlled. In addition, in a condition enclosed by an alternate long and short dash line in FIG. 11, i.e. a condition in which the protrusions 90 are formed on the bottom surface of the dielectric window 41 whose thickness is $3\lambda/8$ or less, it is possible to realize the compatibility of the efficient absorption and the distribution control of the microwave power so as to make the plasma distribution uniform.

In addition, when the microwave power absorption efficiency is improved as described above, it is possible to suppress a so-called mode jump. The standing waves of microwaves are distributed with a specific mode that is determined based on the size of the processing container and the wavelength of electromagnetic waves. The mode of the standing waves partially relies on an electron density. Thus, when the electron density is increased by increasing the microwave input power, the absorption of the microwave power is extremely increased as of a specific electron density so that a mode change phenomenon occurs. This is a phenomenon called a mode jump, and is characterized in that the reflection coefficient of microwaves is rapidly reduced before and after the electron density jump. In addition, when the mode jump occurs, a rate variation of the plasma processing is caused.

According to the inventors' examination, it has been found that the mode jump is also one of the causes of the circumferential deviation of a plasma distribution. Specifically, for example, in the case where a fine deviation in electron density exists in each plasma source, when the microwave input power is increased to be close to an electron density band where the mode jump occurs, a source having a high electron density jumps earlier so that much power is consumed. Then, a source having a low electron density jumps late. In such a case, it has been found that a deviation in plasma excitation timing is caused among the sources, thereby causing the circumferential deviation of the plasma distribution.

In the present exemplary embodiment, since the microwave power absorption efficiency is improved as described above, the reflection coefficient of microwaves is reduced. Then, since the reflection coefficient of microwaves is changed linearly with respect to a change of an electron density so that the reflection coefficient can be suppressed from rapidly decreasing, it is possible to suppress the mode jump. Accordingly, the circumferential deviation of the plasma distribution can be further suppressed.

Figure 12:
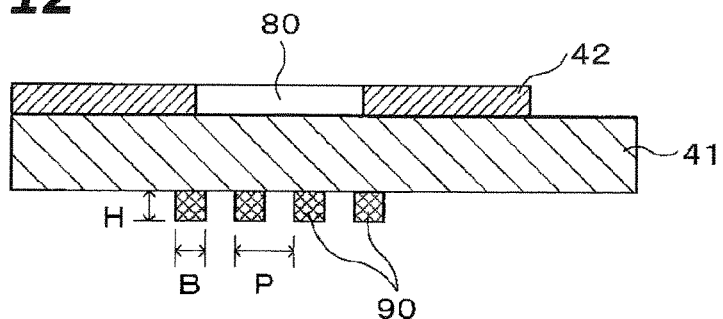
FIG. 12 is an explanatory view schematically illustrating a configuration of protrusions and a slot.

Next, descriptions will be made on a desirable shape of the protrusions 90, more specifically, desirable conditions of the width B and the height H of the protrusions 90 illustrated in FIG. 12. The inventors performed simulations using the dielectric window 41 illustrated in FIG. 12. In addition, in the present simulation, the wavelength λ of microwaves is 40 mm.

First, descriptions will be made on a desirable condition of the width B of the protrusions 90. The conditions of the present simulation are as follows. The thickness of the dielectric window 41 was set to two kinds (11 mm and 13 mm). The number of the protrusions 90 was set to four (4). The interval P of the protrusions 90 was set to the width (B)+10 mm, and the height H of the protrusions 90 was set to 5 mm. In addition, the width B of the protrusions 90 was changed within the range of 5 mm to 20 mm.

Figure 13:
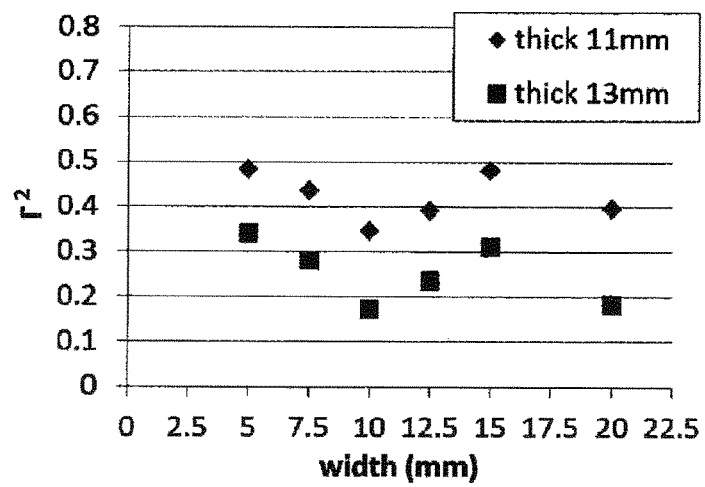
FIG. 13 is a graph representing a microwave power absorption efficiency in a case where the width of the protrusions was changed.

FIG. 13 represents a simulation result. The horizontal axis of FIG. 13 represents the width B of the protrusions 90, and the vertical axis represents $\Gamma^2$. Referring to FIG. 13, even if the thickness of the dielectric window 41 is any one of 11 mm and 13 mm, the $\Gamma^2$ becomes the smallest when the width B is 10 mm (i.e., λ/4), and the microwave power absorption efficiency becomes the best. Accordingly, it has been found that the optimal value of the width B is λ/4.

In addition, according to the inventors' examination, it has been found that when the width B of the protrusions 90 is in the range of λ/4±λ/8, there is a sufficient effect for improving the microwave power absorption efficiency. That is, the width B of the protrusions 90 may be in the range of λ/8 to 3λ/8.

Secondly, descriptions will be made on a desirable condition of the height H of the protrusions 90. The conditions of the present simulation are as follows. The thickness of the dielectric window 41 was set to 11 mm. The number of the protrusions 90 were set to four (4). The width B of the protrusions 90 was set to 10 mm, and the interval P was set to 20 mm. In addition, the height H of the protrusions 90 was changed within the range of 0 (zero) to 20 mm.

Figure 14:
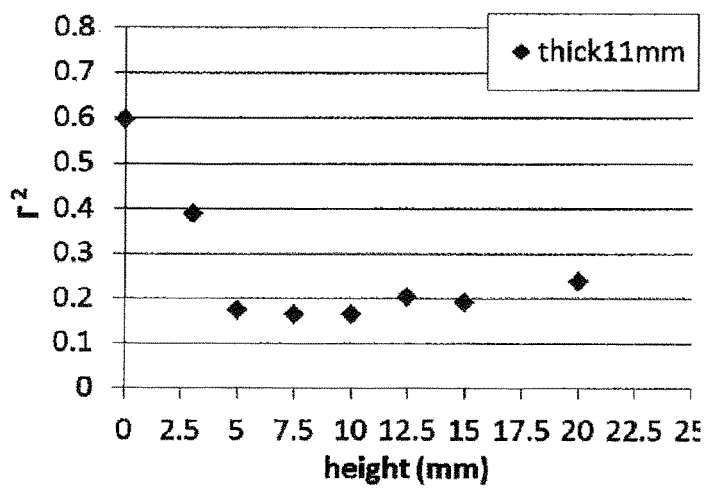
FIG. 14 is a graph representing a microwave power absorption efficiency in a case where the height of the protrusions was changed.

FIG. 14 represents a simulation result. The horizontal axis of FIG. 14 represents the height H of the protrusions 90, and the vertical axis represents $\Gamma^2$. Referring to FIG. 14, when the height H is 2.5 mm or more (i.e., λ/16 or more), the microwave power absorption efficiency is sufficiently improved. Accordingly, the height H of the protrusions 90 may be λ/16 or more.

In addition, while the entire thickness T of the dielectric window 41 is set to 3λ/8 or less in the foregoing exemplary embodiment, only the thickness of the dielectric window 41 at a position where it is required to concentrate a microwave power (e.g., the area below the slots 80) may be set to 3λ/8 or less.

Figure 15:
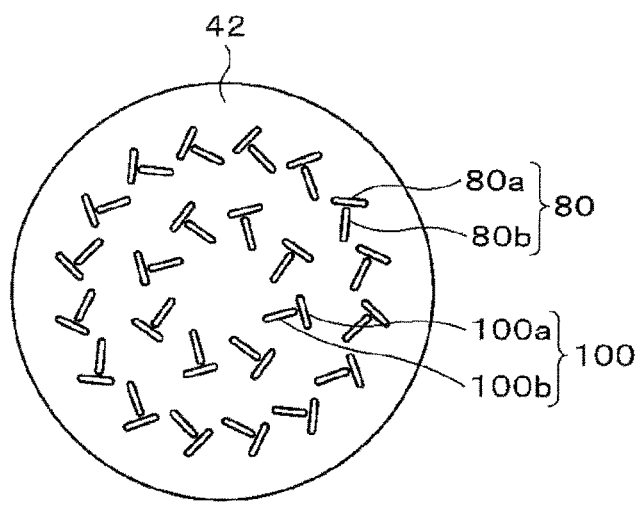
FIG. 15 is a plan view schematically illustrating a configuration of a slot plate according to another exemplary embodiment.
Figure 16:
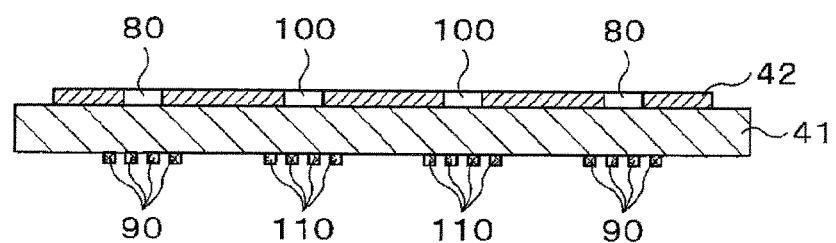
FIG. 16 is a vertical cross-sectional view schematically illustrating a configuration of a dielectric window and a slot plate according to another embodiment.

Further, while the protrusions 90 in the bottom surface of the dielectric window 41 are formed at the positions corresponding to the slots 80 and a plurality of slots 80 are formed on one circumference in the foregoing exemplary embodiment, the number of circumferences may be arbitrarily set without being limited thereto. For example, as illustrated in FIG. 15, a plurality of other slots 100 may be formed inside the plurality of slots 80. The plurality of slots 100 are formed on a circle concentric to the slot plate 42 and arranged at a predetermined interval in the circumferential direction. Each slot 100 has two slot holes 100a and 100b similarly to the slot 80.

In such a case, as illustrated in FIG. 15, a plurality of (e.g., four (4)) annular protrusions 110 may be formed on the bottom surface of the dielectric window 41 at the positions corresponding to the slots 100 (e.g., below the slots 100), as illustrated in FIG. 15. The plurality of protrusions 110 are formed on circles concentric to the slot plate 42 and at a predetermined interval in the radial direction.

In addition, while the plurality slots 80 and 100 are formed in the slot plate 42 on the circles concentric to the slot plate 42 in the foregoing exemplary embodiment, the arrangement of the slots may be arbitrarily set without being limited thereto. For example, the slots may be formed to be scattered in the slot plate 42. In such a case, the protrusions are formed at the positions that correspond to the slots, respectively.

In addition, while the protrusions 90 are formed on the bottom surface of the dielectric window 41 at the positions corresponding to the slots 80 in the foregoing exemplary embodiment, the protrusions 90 may be formed at a position other than the positions corresponding to the slots 80. The protrusions 90 may be formed at a position where it is required to concentrate the microwave power. According to a process condition such as, for example, a processing gas, an electron density distribution may be changed within the plane of the dielectric window 41, and the protrusions 90 may be formed at a position whether the electron density becomes maximum.

Figure 17:
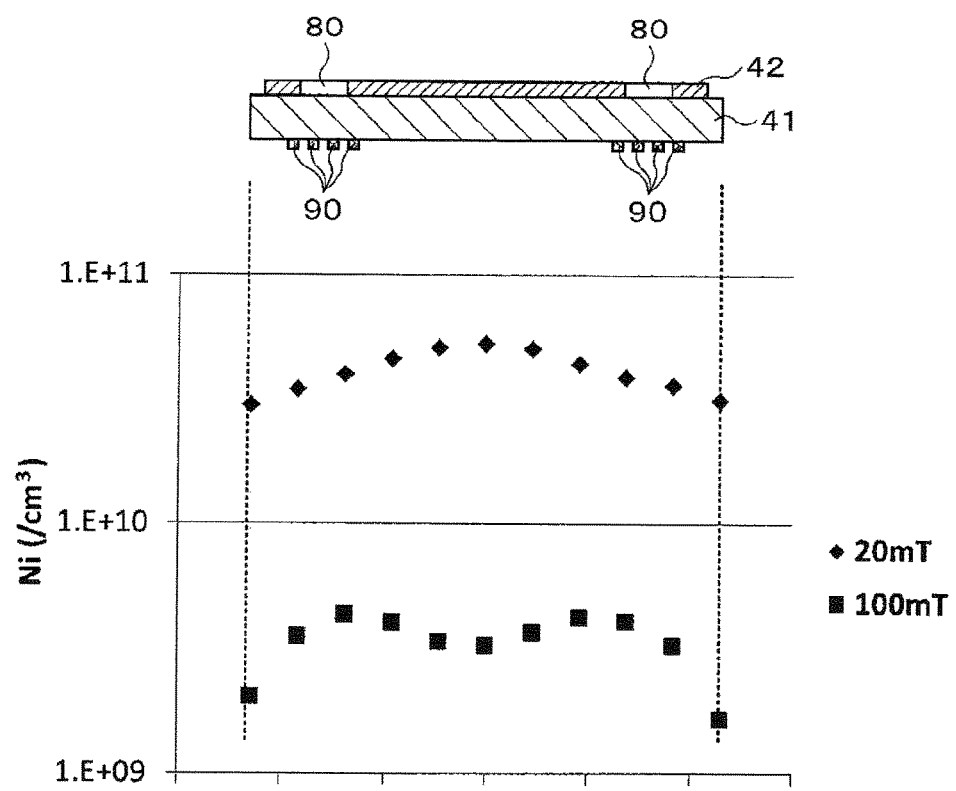
FIG. 17 is a graph representing an electron density distribution in a case where the pressure within the processing container was changed.

In addition, the positions where the protrusions 90 are formed are changed depending on, for example, the pressure within the processing container 10. The inventors performed tests while changing the pressure within the processing container 10 to a high pressure of 100 mTorr (=13 Pa) and a low pressure of 20 mTorr (=2.6 Pa). The results are represented in FIG. 17. Referring to FIG. 17, when the pressure is 100 mTorr, the peak of the electron density is formed below the slots 80, and the protrusions 90 are formed below the slots 80. Meanwhile, when the pressure is 20 mTorr, the peak of the electron density is located at the central position of the dielectric window 41 and between two slots 80. In such a case, the protrusions 90 are formed at the central portion of the dielectric window 41 (i.e., a position other than the positions corresponding to the slots 80). Accordingly, when the pressure within the processing container 10 is high, the protrusions may be formed only below the slots 80, and when the pressure within the processing container 10 is low, the protrusions may be formed at a position other than the positions corresponding to the slots 80.

In addition, while four (4) protrusions 90 are formed on the bottom surface of the dielectric window 41 in the foregoing exemplary embodiment, the number of the protrusions 90 may be arbitrarily set without being limited thereto.

In addition, while the present disclosure is applied to a plasma processing that performs a film forming processing in the foregoing exemplary embodiment, the present disclosure may be applied to a plasma processing that performs a substrate processing other than the film forming processing (e.g., an etching processing or sputtering).

In addition, the substrate to be processed by the plasma processing of the present disclosure may be any of, for example, a semiconductor wafer, an organic EL substrate, a flat panel display (FPD) substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus that performs a plasma processing on an object, the plasma processing apparatus comprising:
   a processing container configured to accommodate the object, the processing container having at least one side wall;
   a dielectric window provided to seal an opening formed in a top portion of the processing container, and configured to transmit microwaves into the processing container; and
   a slot plate located on a top surface of the dielectric window, the slot plate having at least one slot to radiate microwaves to the dielectric window,
   wherein the dielectric window has a thickness of $3\lambda/8$ or less (here, $\lambda$ is a wavelength of the microwaves) at least at a predetermined position where a microwave power is concentrated,
   wherein the dielectric window comprises at least one protrusion located at the predetermined position on a bottom surface of the dielectric window, and each protrusion protrudes downward from the bottom surface,
   wherein each protrusion is disposed at a position corresponding to a location of a respective slot, and
   wherein none of the at least one protrusion is in contact with any of the at least one side wall.

2. The plasma processing apparatus of claim 1, wherein the at least one slot comprises a plurality of slots to radiate microwaves to the dielectric window.

3. The plasma processing apparatus of claim 2, wherein the predetermined position includes a position where an electron density becomes maximum within a plane of the dielectric window.

4. The plasma processing apparatus of claim 1, wherein each protrusion has a width in a range of $\lambda/8$ to $3\lambda/8$.

5. The plasma processing apparatus of claim 1, wherein each protrusion has a height of $\lambda/16$ or more.

6. The plasma processing apparatus of claim 1, wherein the at least one protrusion includes a plurality of protrusions provided on the bottom surface of the dielectric window.

7. The plasma processing apparatus of claim 2, wherein the at least one protrusion includes a plurality of protrusions provided on the bottom surface of the dielectric window.

8. The plasma processing apparatus of claim 7, wherein the plurality of protrusions are positioned along circles concentric to the slot plate with a predetermined interval in a radial direction.

9. The plasma processing apparatus of claim 1, wherein each protrusion has a downwardly elongated rectangular cross-section when viewed from a side.

10. The plasma processing apparatus of claim 1, wherein each protrusion is ring-shaped when viewed from below.

* * * * *